US012669546B2

(12) United States Patent
 Okabe et al.

(10) Patent No.: US 12,669,546 B2
(45) Date of Patent: Jun. 30, 2026

(54) POWER STORAGE SYSTEM

(71) Applicant: HONDA MOTOR CO., LTD., Tokyo (JP)

(72) Inventors: Hiroto Okabe, Tokyo (JP); Yuya Yamashita, Tokyo (JP); Tetsuhiro Kobayashi, Tokyo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 586 days.

(21) Appl. No.: 18/099,652

(22) Filed: Jan. 20, 2023

(65) Prior Publication Data

US 2023/0236256 A1      Jul. 27, 2023

(30) Foreign Application Priority Data

Jan. 24, 2022     (JP) ................................. 2022-008955

(51) Int. Cl.
  *G01R 31/389*      (2019.01)
  *G01R 31/367*      (2019.01)
      (Continued)
(52) U.S. Cl.
  CPC ......... *G01R 31/389* (2019.01); *G01R 31/367* (2019.01); *G01R 31/374* (2019.01);
      (Continued)
(58) Field of Classification Search
  CPC .. G01R 31/389; G01R 31/367; G01R 31/374; G01R 31/388; H02J 7/00714; H02J 7/007182; Y02E 60/10
  See application file for complete search history.

(56) References Cited

U.S. PATENT DOCUMENTS 8,509,975 B2 *   8/2013   Izumi ...................... B60K 6/28
                                                          320/161
2013/0342148 A1 *  12/2013  Yanai ................... B62D 5/0487
                                                          318/472
(Continued)

FOREIGN PATENT DOCUMENTS

JP        2009-121931 A      6/2009
JP        2013-246088 A     12/2013
            (Continued)

OTHER PUBLICATIONS

Mar. 26, 2024, Translation of Japanese Office Action issued for related JP Application No. 2022-008955.
Oct. 31, 2023, translation of Japanese Office Action issued for related JP Application No. 2022-008955.

*Primary Examiner* — Ricky Go
(74) *Attorney, Agent, or Firm* — Paratus Law Group, PLLC

(57)      ABSTRACT

Processing circuitry functionally includes: an internal resistance calculation unit; a reference value obtaining unit configured to obtain a reference value for internal resistance; a correction coefficient calculation unit configured to calculate a correction coefficient indicating how great difference between the internal resistance and the reference value is: a correction value calculation unit configured to calculate a correction value by correcting the reference value using the correction coefficient; and an estimation unit configured to calculate estimated internal resistance, based on the correction value and present voltage. The processing circuitry is configured to control charge and/or discharge of the battery, based on the internal resistance or the estimated internal resistance. The correction value calculation unit is configured to calculate the correction value by correcting the reference value using the correction coefficient calculated in (Continued)

the past when the internal resistance calculation unit is unable to calculate the internal resistance.

6 Claims, 6 Drawing Sheets

(51) Int. Cl.

| | | |
|---|---|---|
| *G01R 31/374* | (2019.01) | |
| *G01R 31/388* | (2019.01) | |
| *H02J 7/90* | (2026.01) | |
| *H02J 7/94* | (2026.01) | |
| *H02J 7/96* | (2026.01) | |

(52) U.S. Cl.
CPC .............. *G01R 31/388* (2019.01); *H02J 7/94* (2026.01); *H02J 7/96* (2026.01); *H02J 7/977* (2026.01)

(56) References Cited

U.S. PATENT DOCUMENTS

| | | | | |
|---|---|---|---|---|
| 2014/0055100 A1* | 2/2014 | Igarashi | .................... | H02J 7/00 |
| | | | | 320/152 |
| 2019/0004115 A1* | 1/2019 | Nakamura | ........... | G01R 31/392 |
| 2020/0233037 A1 | 7/2020 | Yamamoto et al. | | |
| 2020/0264238 A1* | 8/2020 | Furukawa | ............ | G01R 31/389 |
| 2023/0025686 A1 | 1/2023 | Okabe | | |
| 2023/0039183 A1 | 2/2023 | Ohkawa et al. | | |

FOREIGN PATENT DOCUMENTS

| | | | |
|---|---|---|---|
| JP | 2020-119712 A | 8/2020 | |
| JP | 2021-139656 A | 9/2021 | |
| JP | 2023-013857 A | 1/2023 | |
| JP | 7382366 B2 | 11/2023 | |
| WO | WO 2021/131184 A1 | 7/2021 | |

* cited by examiner

POWER STORAGE SYSTEM

CROSS-REFERENCE TO RELATED APPLICATION

This application is based on and claims priority under 35 USC § 119 from Japanese Patent Application No. 2022-008955, filed on Jan. 24, 2022, the entire contents of which are incorporated herein by reference.

TECHNICAL FIELD

The present invention relates to a power storage system.

BACKGROUND

In recent years, as a specific countermeasure against global climate change, efforts for implementing a low-carbon society or a decarbonized society have been active. In vehicles such as automobiles, a reduction in $CO_2$ emission amount is strongly required, and electrification of a drive source is rapidly advancing. Specifically, development of vehicles (hereinafter, also referred to as "electrically driven vehicles") such as electrical vehicles or hybrid electrical vehicles, which include an electric motor as a drive source and a battery as a secondary battery capable of supplying electric power to the electric motor, is underway.

As for a power storage system including a battery for an electrically driven vehicle, in order to control charge and discharge of the battery appropriately, it may be important to estimate present internal resistance of the battery with high accuracy (reliability). For example, JP2013-246088A discloses: monitoring current I and closed circuit voltage CCV of a battery; accumulating data D of a fluctuation ΔI in the current I, which is a value when the current I fluctuates more widely than a predetermined threshold Th, and a fluctuation ΔV in the closed circuit voltage CCV; calculating the regression slope ΔV/ΔI of a relationship between the independent variable of the fluctuation ΔI and the dependent variable of the fluctuation ΔV, based on a plurality of pieces of the data D; and considering the regression slope ΔV/ΔI as internal resistance R of the battery.

In the related art, however, there is room for improvement since present internal resistance of a battery cannot be estimated highly accurately if the internal resistance of the battery cannot be calculated based on voltage and current of the battery, for example, when power of the battery does not fluctuate (when the fluctuation ΔV and/or the fluctuation ΔI is substantially 0).

The present disclosure provides a power storage system that enables highly accurate calculation of present internal resistance of a battery even if the internal resistance of the battery cannot be calculated based on voltage and current of the battery.

SUMMARY

A power storage system according to an aspect of the present disclosure includes:

- a battery;
- a voltmeter configured to measure voltage of the battery;
- an ammeter configured to measure current of the battery;
- a temperature sensor configured to measure temperature of the battery;
- processing circuitry configured to control charge and/or discharge of the battery, based on the voltage, the current, and the temperature, wherein the processing circuitry functionally includes:

- an internal resistance calculation unit configured to calculate internal resistance of the battery, based on the voltage and the current;
- a reference value obtaining unit configured to obtain a reference value for the internal resistance of the battery corresponding to present state of charge and the present temperature of the battery from a map of the state of charge and the temperature to the reference value,
- a correction coefficient calculation unit configured to calculate a correction coefficient indicating how great difference between the internal resistance and the reference value is;
- a correction value calculation unit configured to calculate a correction value by correcting the reference value using the correction coefficient; and
- an estimation unit configured to calculate estimated internal resistance, which is an estimated present value of the internal resistance, based on the correction value and the present voltage, the processing circuitry is configured to control the charge and/or discharge of the battery, further based on the internal resistance or the estimated internal resistance, and the correction value calculation unit is configured to calculate the correction value by correcting the reference value using the correction coefficient calculated in the past when the internal resistance calculation unit is unable to calculate the internal resistance.

According to the present invention, it becomes possible to provide a power storage system that enables highly accurate calculation of present internal resistance of a battery even if the internal resistance of the battery cannot be calculated based on voltage and current of the battery.

BRIEF DESCRIPTION OF DRAWINGS

Exemplary embodiments of the present disclosure will be described in detail based on the following figures, wherein:

FIGS. 6A to 6C illustrate a relationship among a state of the battery BAT, internal resistance R, a correction value, and a reference value.

DESCRIPTION OF EMBODIMENTS

In the following, some embodiments of a power storage system of the present disclosure will be described in detail with reference to the drawings. Although examples will be described in which the power storage system of the present disclosure is a vehicular power storage system installed in a vehicle such as an automobile, the present disclosure is not limited thereto and can be applied to a variety of power storage systems. The same or similar elements are denoted by the same or similar reference signs, and a description thereof may be omitted or simplified as appropriate.

Vehicle

Figure 1:
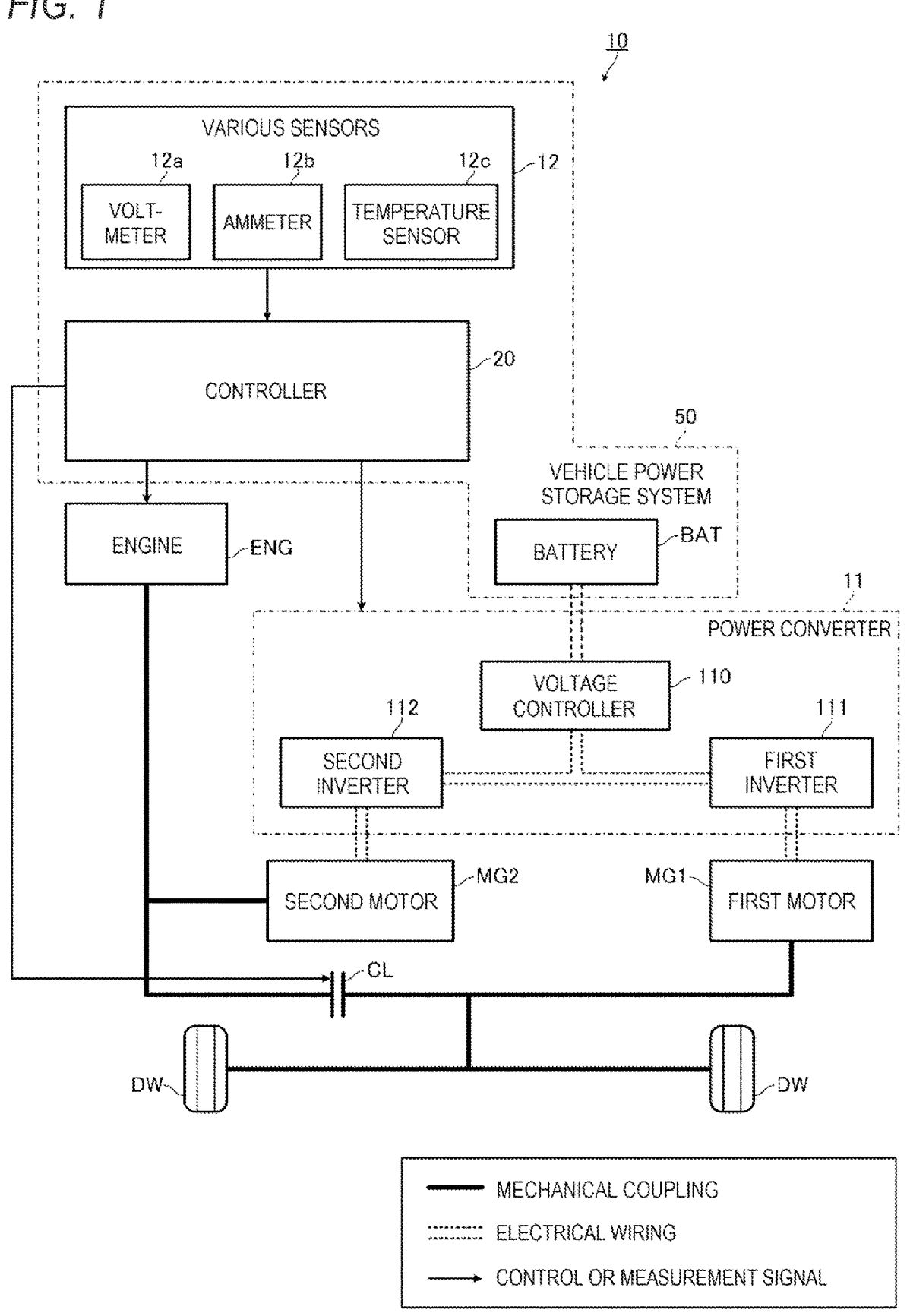
FIG. 1 illustrates a schematic configuration of a vehicle 10 in which a vehicle power storage system 50 is installed.

First, a vehicle in which the vehicle power storage system of the present embodiment is installed will be described. As shown in FIG. 1, a vehicle 10, in which a vehicle power storage system 50 of the present embodiment is installed, is a hybrid electric vehicle and includes an engine ENG, a first motor MG1, a second motor MG2, a battery BAT, a clutch CL, a power converter 11, various sensors 12, and a controller 20. In FIG. 1, thick solid lines indicates mechanical coupling, double dotted lines indicate electrical wiring, and thin solid arrows indicate flow of control or measurement signals.

The engine ENG is, for example, a gasoline or diesel engine and is configured to output power generated by burning supplied fuel. The engine ENG is coupled to the second motor MG2 and to drive wheels DW of the vehicle 10 via the clutch CL. The power output from the engine ENG (hereinafter, also referred to as "output of the engine ENG") is transmitted to the second motor MG2 when the clutch CL is released and is transmitted to the second motor MG2 and the drive wheels DW when the clutch CL is engaged. The second motor MG2 and the clutch CL will be described later.

The first motor MG1 is a motor (drive motor) mainly used as a drive source of the vehicle 10 and is, for example, an AC motor. The first motor MG1 is electrically connected to the battery BAT and the second motor MG2 via the power converter 11. The first motor MG1 can be supplied with electric power from at least the battery BAT or the second motor MG2. The first motor MG1 is configured to operate as an electric motor to output power for the vehicle 10 to travel when the first motor MG1 is supplied with electric power. The first motor MG1 is coupled to the drive wheels DW, and power output from the first motor MG1 (hereinafter, also referred to as "output of the first motor MG1") is transmitted to the drive wheels DW. The vehicle 10 is configured to travel with at least the output of the engine ENG or the first motor MG1 transmitted (supplied) to the drive wheels DW.

The first motor MG1 is configured to output regenerated power (perform regeneration) when the brakes of the vehicle 10 is applied (and the first motor MG1 is rotated by the engine ENG or the drive wheels DW). The regenerated power is, for example, supplied to the battery BAT via the power converter 11. Accordingly, the battery BAT can be charged with the regenerated power.

The regenerated power does not have to be supplied to the battery BAT and may be supplied to the second motor MG2 via the power converter 11 for disposal in which the regenerated power is consumed without being used to charge the battery BAT. At the time of the disposal, the regenerated power supplied to the second motor MG2 drives the second motor MG2, the power generated by the second motor MG2 is transmitted to and consumed in the engine ENG due to mechanical friction loss and the like.

The second motor MG2 is a motor (power-generating motor) mainly used as a generator and is, for example, an AC motor. The second motor MG2 is configured to generate electric power with output of the engine ENG driving the second motor MG2. The electric power generated by the second motor MG2 is supplied to at least the battery BAT or the first motor MG1 via the power converter 11. If the electric power is supplied to the battery BAT, the battery BAT can be charged. If the electric power is supplied to the first motor MG1, the first motor MG1 can be driven thereby.

The power converter 11 is a device (power control unit PCU) configured to transform current and is connected to the first motor MG1, the second motor MG2, and the battery BAT. The power converter 11 includes, for example, a first inverter 111, a second inverter 112, and a voltage controller 110, which are electrically connected to one another.

The voltage controller 110 is configured to transform current and may be a DC-to-DC converter. For example, when the power of the battery BAT is supplied to the first motor MG1, the voltage controller 110 steps up the output voltage of the battery BAT and outputs it to the first inverter Ill. For example, when regenerated power is output from the first motor MG1, the voltage controller 110 steps down the output voltage of the first motor MG1 received via the first inverter 111 and outputs it to the battery BAT. When electric power is generated by the second motor MG2, the voltage controller 110 steps down the output voltage of the second motor MG2 received via the second inverter 112 and outputs it to the battery BAT.

When the power of the battery BAT is supplied to the first motor MG1, the first inverter 111 converts direct current of the battery BAT received via the voltage controller 110 into alternating current and outputs it to the first motor MG1. When regenerated power is output from the first motor MG1, the first inverter 111 converts alternating current received from the first motor MG1 to direct current and outputs it to the voltage controller 110. When the regenerated power is disposed of, the first inverter 111 converts the alternating current received from the first motor MG1 into direct current and outputs it to the second inverter 112.

When the electric power is generated by the second motor MG2, the second inverter 112 converts alternating current received from the second motor MG2 into direct current and outputs it to the voltage controller 110. When the regenerated power is disposed of, the second inverter 112 converts direct current received from the first motor MG1 via the first inverter 111 into alternating current and outputs it to the second motor MG2.

The battery BAT is a secondary battery configured to charge and discharge and includes a plurality of cells connected in series or in series parallel. The terminal voltage of the battery BAT is a high voltage, such as 100-400 V. The cells of the battery BAT may be a lithium-ion battery, a nickel-metal hydride battery, or the like.

The clutch CL can be switched to two states: one is a connected state (engaged state), in which a power transmission path from the engine ENG to the drive wheels DW is formed by engaging the clutch CL; and the other is a disconnected state (released state), in which the power transmission path is disconnected by releasing the clutch CL. The output of the engine ENG is transmitted to the drive wheels DW when the clutch CL is in the connected state and is not transmitted to the drive wheels DW when the clutch CL is in the disconnected state.

The various sensors 12 include, for example, a vehicle speed sensor configured to measure the speed (also referred to as "vehicle speed") of the vehicle 10, an accelerator position (AP) sensor configured to track the position of (operational input onto) the accelerator pedal of the vehicle 10, a brake sensor configured to track the position of (operational input onto) the brake pedal of the vehicle 10, and battery sensors configured to correct a variety of information related to the battery BAT.

The battery sensors includes, for example, a voltmeter 12a configured to measure voltage V of the battery BAT, and an ammeter 12b configured to measure current I of the battery BAT. The voltmeter 12a is configured to measure closed circuit voltage of the battery BAT as the voltage V of the battery BAT. The ammeter 12b is configured to measure input/output current of the battery BAT as the current I of the battery BAT. In the present embodiment, the current I of the battery BAT becomes a positive value when the battery BAT is discharged and becomes a negative value when the battery BAT is charged.

Output signals from the various sensors 12 including the voltmeter 12a and the ammeter 12b are transmitted to the controller 20. In addition to the voltmeter 12a and the ammeter 12b, the various sensors 12 may include (as a battery sensor) a temperature sensor 12c configured to measure temperature of the battery BAT.

The controller 20 is configured to communicate with the engine ENG, the clutch CL, the power converter 11, and the various sensors 12. The controller 20 is configured to control, for example, the output of the engine ENG, the output of the first motor MG1 and the second motor MG2 by controlling the power converter 11, and the state of the clutch CL.

Further, the controller 20 is configured to control charge and discharge of the battery BAT. For example, the controller 20 estimates present internal resistance (estimated internal resistance $R_{now}$ to be described later) of the battery BAT, sets an upper limit (charging power upper limit $TW_{IN\_now}$ to be described later) on charging power, which is power for charging the battery BAT, based on the estimated present internal resistance, and performs control to prevent charging power exceeding the upper limit from being supplied to the battery BAT during charge of the battery BAT. The controller 20 is configured to control the charging power and the discharging power for the battery BAT, for example, by controlling the power converter 11. In addition, the controller 20 is configured to estimate state of charge (SoC) of the battery BAT, based on the estimated present internal resistance, the voltage V measured by the voltmeter 12a, and the current I measured by the ammeter 12b.

The controller 20 may be an electronic control unit (ECU) including, for example, processing circuitry configured to execute a variety of processing for controlling the vehicle 10, a memory configured to store a variety of information (data and programs) for controlling the vehicle 10, and an input/output device configured to control input and output of data between the inside and outside of the controller 20. The controller 20 may be a single ECU or a plurality of ECUs operable in cooperation with one another.

The vehicle power storage system 50 of the present embodiment includes the battery BAT, the various sensors 12 (specifically, the voltmeter 12a and the ammeter 12b), and the controller 20.

Driving Modes of Vehicle

Next, driving modes of the vehicle 10 will be described. The driving modes of the vehicle 10 includes an EV driving mode, a hybrid driving mode, and an engine driving mode, and the vehicle 10 travels in one of them under the control of the controller 20.

EV Driving Mode

The EV driving mode is a driving mode in which the vehicle 10 travels using the output of the first motor MG1 with only electric power from the battery BAT supplied to the first motor MG1.

Specifically, in the EV driving mode, the controller 20 causes the clutch CL to be in the disconnected state and cuts the fuel supply off from the engine ENG (fuel cut off) to stops the engine ENG from outputting power. Therefore, in the EV driving mode, the second motor MG2 does not generate electric power. The controller 20 causes the first motor MG1 to be supplied with only the electric power of the battery BAT, and the vehicle 10 travels using the output of the first motor MG1.

The controller 20 permits the vehicle 10 to travel in the EV driving mode on the condition that driving force (hereinafter, also referred to as "required driving force") required for traveling of the vehicle 10 is obtainable from the output of the first motor MG1 with only electric power from the battery BAT supplied to the first motor MG1.

Hybrid Driving Mode

The hybrid driving mode is a driving mode in which the vehicle 10 travels mainly using the output of the first motor MG1 with at least electric power generated by the second motor MG2 supplied to the first motor MG1.

Specifically, in the hybrid driving mode, the controller 20 causes the clutch CL to be in the disconnected state, allows the fuel supply to the engine ENG to cause the engine ENG to output power, and causes the second motor MG2 to be driven by the power of the engine ENG. Therefore, in the hybrid driving mode, the second motor MG2 generates electric power. The controller 20 disconnects the power transmission path by releasing the clutch CL and causes the first motor MG1 to be supplied with the electric power generated by the second motor MG2, and the vehicle 10 travels using the output of the first motor MG1.

The electric power supplied from the second motor MG2 to the first motor MG1 is larger than that supplied from the battery BAT to the first motor MG1. Therefore, the output of the first motor MG1 in the hybrid driving mode is larger than in the EV driving mode, and larger driving force (hereinafter, also referred to as "output of the vehicle 10") for traveling of the vehicle 10 is obtainable.

In addition, the controller 20 may cause the electric power of the battery BAT to be supplied to the first motor MG1 as necessary in the hybrid driving mode. That is, in the hybrid driving mode, the controller 20 may supply the first motor MG1 with electric power of both the second motor MG2 and the battery BAT. In this case, as compared to a case in which the first motor MG1 is supplied with only the electric power of the second motor MG2, the electric power supplied to the first motor MG1 can be increased, and even larger driving force is obtainable.

Engine Driving Mode

The engine driving mode is a driving mode in which the vehicle 10 travels mainly using the output of the engine ENG.

Specifically, in the engine driving mode, the controller 20 causes the clutch CL to be in the connected state and allows the fuel supply to the engine ENG to cause the engine ENG to output power. Since the power transmission path is formed by engaging the clutch CL, the power of the engine ENG is transmitted to the drive wheels DW to drive the drive wheels DW. Accordingly, in the engine driving mode, the controller 20 causes the engine ENG to output power, and the vehicle 10 travels using the power.

In addition, the controller 20 may cause the electric power of the battery BAT to be supplied to the first motor MG1 as necessary in the engine driving mode. In this case, as compared to a case in which the vehicle 10 travels using only the power of the engine ENG, the vehicle 10 can also use the power of the first motor MG1 by supplying the electric power of the battery BAT to the first motor MG1, and larger driving force is obtainable. Further, since the output of the engine ENG can be reduced, fuel efficiency of the vehicle 10 can be enhanced.

Controller

Next, the controller 20 will be described in detail. As described above, the controller 20 is configured to control charge and discharge of the battery BAT. Specifically, the controller 20 is configured to control the charging power and the discharging power for the battery BAT, according to internal resistance of the battery BAT.

Figure 2:
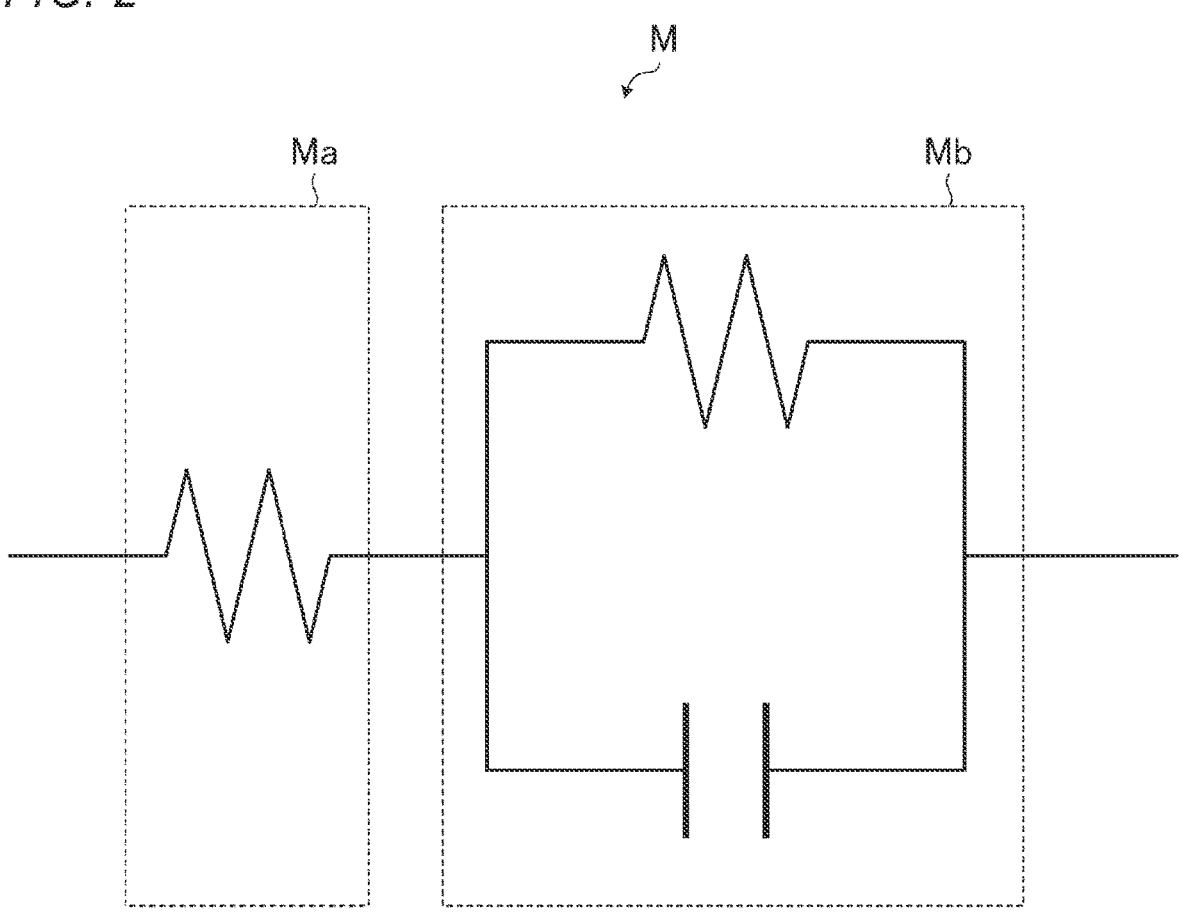
FIG. 2 illustrates an equivalent circuit of internal resistance of a battery BAT in the vehicle power storage system 50.

FIG. 2 illustrates an equivalent circuit M, which is an example of an equivalent circuit of the internal resistance of the battery BAT. As in the equivalent circuit M, the internal resistance of the battery BAT includes a resistance component (R component) Ma and a parallel-RC component Mb connected in series.

Figure 3:
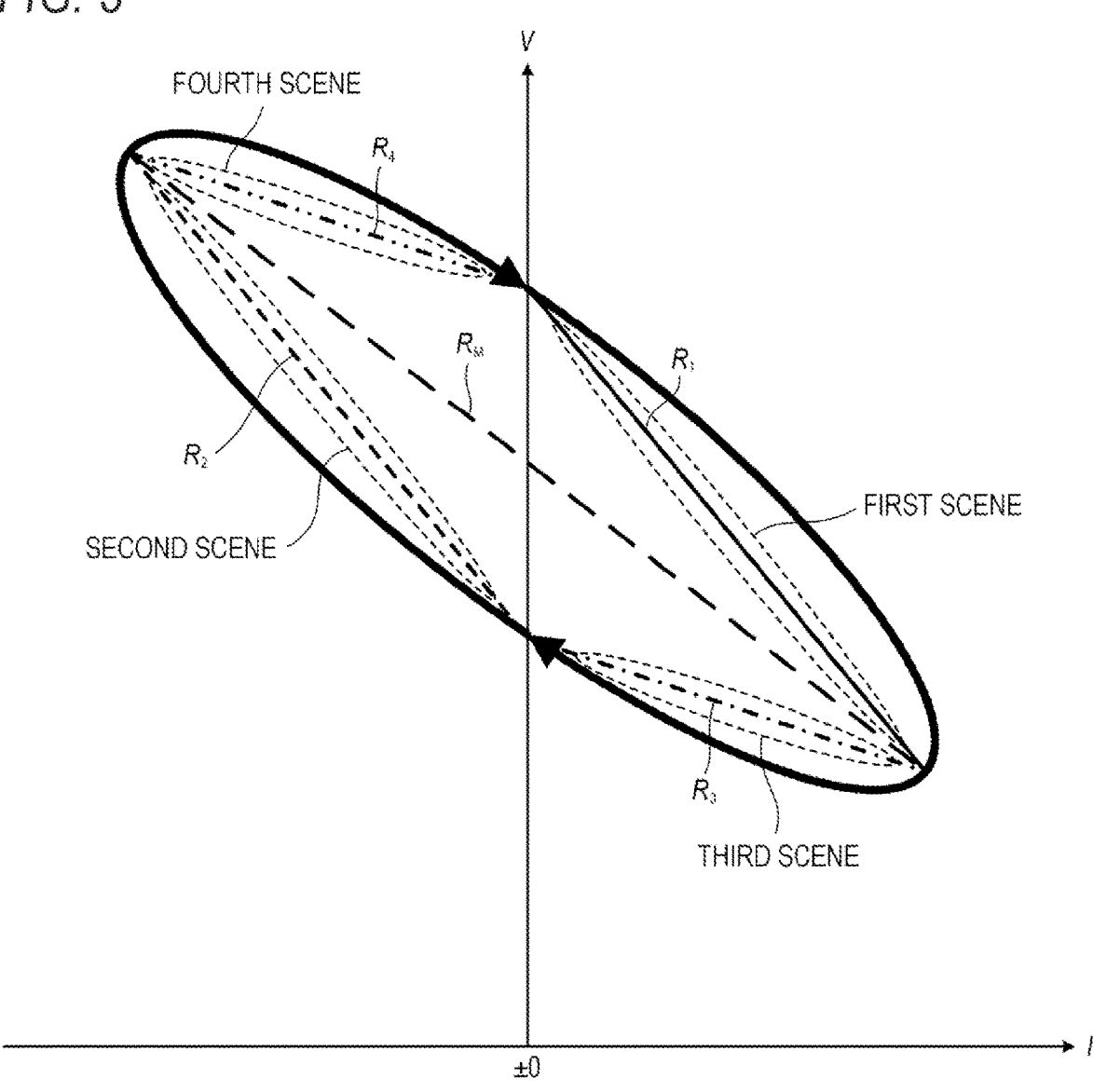
FIG. 3 illustrates a current-voltage characteristic of the battery BAT in the vehicle 10.

FIG. 3 illustrates a current-voltage characteristic (hereinafter, also referred to as an "I-V characteristic") of the battery BAT in the vehicle 10. As for the battery BAT in the vehicle 10, four scenes shown in FIG. 3 can be expected. In FIG. 3, the vertical axis represents the voltage V of the battery BAT, the horizontal axis represents the current I of the battery BAT, and the ratio (or the slope) of a fluctuation in the voltage V to a fluctuation in the current I corresponds to internal resistance R of the battery BAT. In the following, each of the four scenes will be described.

The first scene is a scene in which the current I of the battery BAT is positive and on the increase. The first scene can be observed, for example, when a driver steps on the accelerator (when the accelerator pedal moves forth) while the vehicle 10 is being driven by power of the first motor MG1 with the first motor MG1 supplied with electric power at least from the battery BAT. In the first scene, the internal resistance R of the battery BAT is relatively high. Specifically, internal resistance $R_1$, which is the internal resistance R in the first scene, is higher than internal resistance $R_M$, which is the internal resistance R averaged over the four scenes.

The second scene is a scene in which the current I of the battery BAT is negative and on the decrease. The second scene can be observed, for example, when a driver steps on the brakes (when the brake pedal moves forth) while the vehicle 10 is traveling. In the second scene, the internal resistance R of the battery BAT is relatively high. Specifically, internal resistance $R_2$, which is the internal resistance R in the second scene, is higher than the internal resistance $R_M$.

The third scene is a scene in which the current I of the battery BAT is positive and on the decrease. The third scene can be observed, for example, when a driver releases the accelerator (when the accelerator pedal moves back) while the vehicle 10 is being driven by power of the first motor MG1 with the first motor MG1 supplied with electric power at least from the battery BAT. In the third scene, the internal resistance R of the battery BAT is relatively low. Specifically, internal resistance $R_3$, which is the internal resistance R in the third scene, is lower than the internal resistance $R_M$.

The fourth scene is a scene in which the current I of the battery BAT is negative and on the increase. The fourth scene can be observed, for example, when a driver releases the brakes (when the brake pedal moves back) while the vehicle 10 is being braked. In the fourth scene, the internal resistance R of the battery BAT is relatively low. Specifically, internal resistance $R_4$, which is the internal resistance R in the fourth scene, is lower than the internal resistance $R_M$.

As described above, the absolute value of the current I of the battery BAT in the vehicle 10 may be on the increase or on the decrease. The internal resistance R of the battery BAT is relatively high when the absolute value of the current I of the battery BAT is on the increase as in the first and the fourth scenes but is relatively low when the absolute value of the current I of the battery BAT is on the decrease as in the second and third scenes. In addition, the internal resistance R of the battery BAT fluctuates according to, for example, SoC and/or temperature of the battery BAT.

Specifically, resistance of the R component Ma and/or the parallel-RC component Mb in the internal resistance of the battery BAT fluctuates according to, for example, fluctuation in the absolute value of the current I, the SoC, and/or temperature of the battery BAT.

Figures 4A, 4B, 4C, 4D:
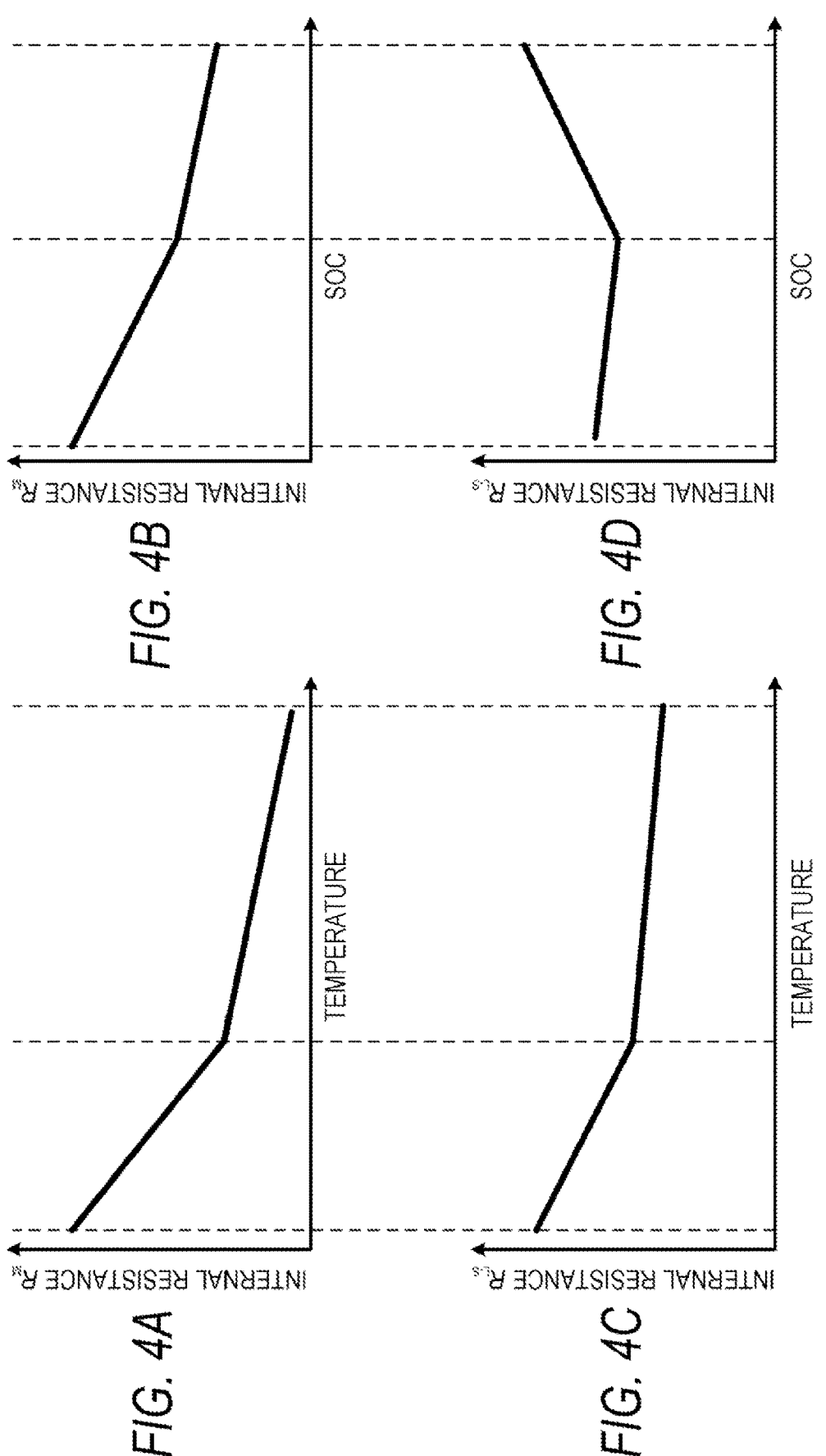
FIGS. 4A to 4D illustrate characteristics of an R component Ma and a parallel-RC component Mb in the internal resistance of the battery BAT.

FIG. 4A illustrates a relationship between the resistance of the R component Ma (vertical axis) and the battery temperature (horizontal axis), FIG. 4B illustrates a relationship between the resistance of the R component Ma (vertical axis) and the SoC (horizontal axis), FIG. 4C illustrates a relationship between the resistance of the parallel-RC component Mb (vertical axis) and the battery temperature (horizontal axis), and FIG. 4D illustrates a relationship between the resistance of the parallel-RC component Mb (vertical axis) and the SoC (horizontal axis). The internal resistance R of the battery BAT can fluctuate according to the SoC and the battery temperature since the R component Ma and the parallel-RC component Mb have characteristics, for example, shown in FIGS. 4A to 4D.

In order to control charge and discharge of the battery BAT appropriately, it may be important to estimate the present internal resistance R of the battery BAT with high accuracy (reliability). The controller 20 is configured to estimate the present internal resistance R of the battery BAT with high accuracy.

For example, the controller 20 is configured to obtain the voltage V of the battery BAT measured by the voltmeter 12a and the current I of the battery BAT measured by the ammeter 12b at predetermined intervals (for example, at 1-second intervals). The controller 20 uses the voltage V obtained most recently as present voltage $V_{now}$ and the current I obtained most recently as present current $I_{now}$.

Figure 5:
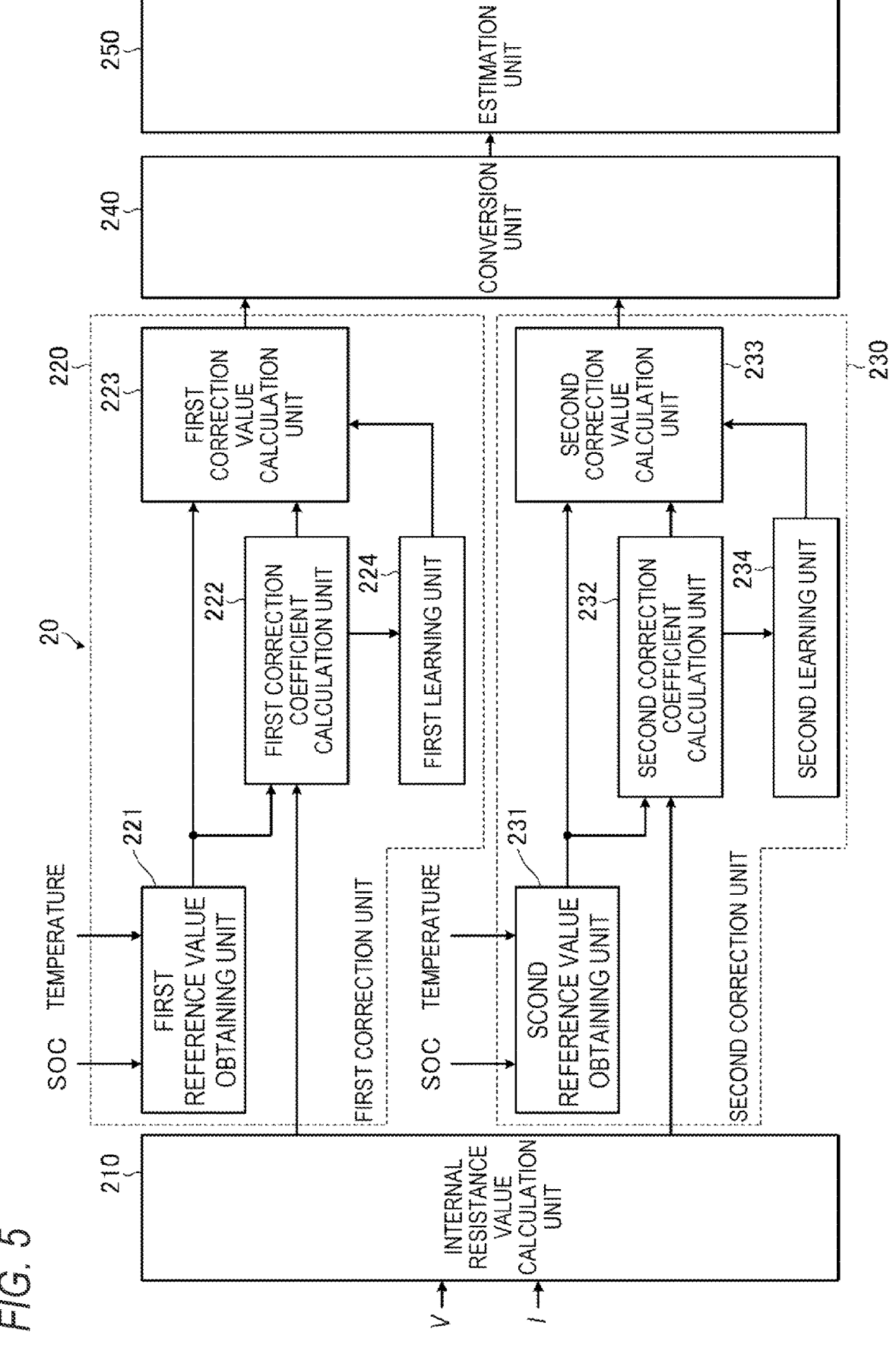
FIG. 5 is a block diagram illustrating a functional configuration of a controller 20 in the vehicle power storage system 50.

As shown in FIG. 5, the controller 20 functionally includes, for example, an internal resistance calculation unit 210, a first correction unit 220, and a second correction unit 230, a conversion unit 240, an estimation unit 250, which are implemented by processing circuitry of the controller 20 executing programs stored in the memory of the controller 20.

The internal resistance calculation unit 210 is configured to calculate the internal resistance R of the battery BAT, based on the voltage V of the battery BAT measured by the voltmeter 12a and the current I of the battery BAT measured by the ammeter 12b.

For example, each time the voltage V and the current I are obtained, the internal resistance calculation unit 210 calculates the internal resistance R of the battery BAT for a period between the previous obtainment of the voltage V and the current I and the latest obtainment thereof. The internal resistance R for this period is calculable, for example, by dividing a voltage fluctuation $\Delta V$, which is difference between the voltage V obtained this time (that is, the voltage $V_{now}$) and that obtained last time, by a current fluctuation $\Delta I$, which is difference between the current I obtained this time (that is, the current $I_{now}$) and that obtained last time.

For example, the internal resistance calculation unit 210 classifies the internal resistance R as one of the four scenes, based on whether the current I for the period is positive or negative and whether it is on the increase or on the decrease and calculates the average of the internal resistance R scene by scene to calculate the internal resistance $R_1$ to $R_4$.

In addition, the internal resistance calculation unit 210 calculates the internal resistance $R_M$ from the internal resistance $R_1$ to $R_4$ and outputs it to a first correction coefficient calculation unit 222 (to be described later) of the first correction unit 220.

The internal resistance $R_M$ is an example of a first internal resistance, which reflects a characteristic of the R component Ma (for example, resistance thereof) in the internal resistance R of the battery BAT. That is, similarly to the R component Ma, the internal resistance $R_M$ has dependence on the battery temperature (hereinafter, also referred to as "temperature dependence") shown in FIG. 4A and on the SoC (hereinafter, also referred to as "SoC dependence") shown in FIG. 4B.

In addition, the internal resistance calculation unit 210 calculates internal resistance $R_L$, which is the average of the internal resistance $R_1$ and $R_2$ (the absolute value of the current I of the battery BAT is on the increase in the first and the second scenes) and internal resistance $R_S$, which is the average of the internal resistance $R_3$ and $R_4$ (the absolute value of the current I of the battery BAT is on the decrease in the third and the fourth scenes). The internal resistance calculation unit 210 calculates internal resistance $R_{L-S}$, which is $R_L - R_S$, and outputs it to a second correction coefficient calculation unit 232 (to be described later) of the second correction unit 230.

The internal resistance $R_{L-S}$ is an example of a second internal resistance, which reflects a characteristic of the parallel-RC component Mb (for example, resistance thereof) in the internal resistance R of the battery BAT. That is, similarly to the parallel-RC component Mb, the internal resistance $R_{L-S}$ has temperature dependence shown in FIG. 4C and SoC dependence shown in FIG. 4D.

In general, the temperature dependence of the internal resistance $R_M$ and that of the internal resistance $R_{L-S}$ show similar tendencies as shown in FIGS. 4A and 4C most of the time. On the other hand, the SoC dependence of the internal resistance $R_M$ and that of the internal resistance $R_{L-S}$ show greatly different tendencies as shown in FIG. 4B and FIG. 4D.

The first correction unit 220 is configured to calculate internal resistance $R_M'$, which is an estimated present value of the internal resistance $R_M$. The internal resistance $R_M'$ is used for calculation of the estimated internal resistance R (to be described later), which is an estimated present value of the internal resistance R of the battery BAT. Specifically, the first correction unit 220 functionally includes a first reference value obtaining unit 221, the first correction coefficient calculation unit 222, and a first correction value calculation unit 223.

The first reference value obtaining unit 221 is configured to obtain a reference value $S_M$, which is a reference value for the internal resistance $R_M$ and is dependent on present SoC and present temperature of the battery BAT, at predetermined timing (for example, at regular intervals). For example, a map (hereinafter, referred to as an "$S_M$ map") of SoC and temperature of the battery BAT to a reference value $S_M$ may be stored in the memory of the controller 20, and the first reference value obtaining unit 221 may obtain the reference value $S_M$ corresponding to present SoC and present temperature of the battery BAT therefrom each time the voltage V and the current I are obtained. The first reference value obtaining unit 221 outputs the reference value $S_M$ to the first correction coefficient calculation unit 222 and the first correction value calculation unit 223. The reference value $S_M$ is an example of a first reference value, and the $S_M$ map is an example of a first map.

The first correction coefficient calculation unit 222 is configured to calculate a correction coefficient $k_M$, which indicates how great difference between the internal resistance $R_M$ calculated by the internal resistance calculation unit 210 and the reference value $S_M$ obtained by the first reference value obtaining unit 221 is. The first correction coefficient calculation unit 222 calculates the correction coefficient $k_M$, for example, by dividing the internal resistance $R_M$ by the reference value $S_M$ (that is, $k_M$ may be $R_M/S_M$). In this case, the correction coefficient $k_M$ indicates how great difference between the internal resistance $R_M$ and the reference value $S_M$ is by the ratio of the internal resistance $R_M$ to the reference value $S_M$. The first correction coefficient calculation unit 222 outputs the correction coefficient $k_M$ to the first correction value calculation unit 223.

The first correction value calculation unit 223 is configured to calculate the internal resistance $R_M'$ by correcting the reference value $S_M$ acquired by the first reference value obtaining unit 221 using the correction coefficient $k_M$ calculated by the first correction coefficient calculation unit 222. The first correction value calculation unit 223 calculates the internal resistance $R_M'$, for example, by multiplying the reference value $S_M$ by the correction coefficient $k_M$ (that is, $R_M'$ may be $k_M S_M$) and outputs it to the conversion unit 240. The internal resistance $R_M'$ is an example of a first correction value.

In general, power of the battery BAT does not fluctuate widely, for example, when the vehicle 10 is cruising on an expressway at a constant speed. In such a case, the voltage fluctuation $\Delta V$ and/or the current fluctuation $\Delta I$ may be substantially 0, and the internal resistance calculation unit 210 may be unable to calculate the internal resistance R appropriately. In this case, the first correction coefficient calculation unit 222 is unable to calculate the correction coefficient $k_M$ appropriately, and the first correction value calculation unit 223 is also unable to calculate the internal resistance $R_M'$ appropriately based on the correction coefficient $k_M$.

In such a case, the internal resistance $R_M'$ that has been appropriately calculated most recently may be usable. In this case, however, the internal resistance $R_M'$ cannot quickly respond to fluctuation in SoC and/or temperature of the battery BAT, deteriorating accuracy of the estimated internal resistance $R_{now}$, which is calculated based on the internal resistance $R_M'$.

Therefore, if the internal resistance calculation unit 210 is unable to calculate the internal resistance R appropriately (for example, if the voltage fluctuation $\Delta V$ and/or the current fluctuation $\Delta I$ is within a predetermined range centered on 0), the first correction value calculation unit 223 calculates the internal resistance $R_M'$ by correcting the reference value $S_M$ obtained by the first reference value obtaining unit 221 using the correction coefficient $k_M$ that has been calculated in the past.

In the present embodiment, in order to calculate the internal resistance $R_M'$ appropriately by the first correction value calculation unit 223 even if the internal resistance calculation unit 210 is unable to calculate the internal resistance R of the battery BAT appropriately, the first correction unit 220 further includes a first learning unit 224. After the first correction coefficient calculation unit 222 calculates the correction coefficient $k_M$, the first correction coefficient calculation unit 222 outputs the correction coefficient $k_M$ also to the first learning unit 224.

The first learning unit 224 is configured to learn from the correction coefficient $k_M$ calculated by the first correction coefficient calculation unit 222 and to output a correction coefficient $K_M$ as training results to the first correction value calculation unit 223. In the present embodiment, the correction coefficient $K_N$ is the correction coefficient $k_M$ averaged over a certain period of time, but the present disclosure is not limited thereto. For example, the correction coefficient $K_M$ may be the median instead of the average. The certain period may be a past predetermined period or may start when (to be described later) the first learning unit 224 starts learning most recently, but the present disclosure is not limited thereto. The certain period may be predetermined by the manufacturer of the vehicle 10 or the controller 20 and may be stored in the memory of the controller 20.

If the internal resistance calculation unit 210 is unable to calculate the internal resistance R appropriately, or if the first correction coefficient calculation unit 222 is unable to calculate the correction coefficient $k_M$, the first correction value calculation unit 223 obtains the correction coefficient $K_M$ from the first learning unit 224.

In this case, the first correction value calculation unit 223 calculates the internal resistance $R_M'$, based on the correction coefficient $K_M$ obtained from the first learning unit 224 instead of the correction coefficient $k_M$. That is, the first correction value calculation unit 223 calculates the internal resistance $R_M'$ by multiplying the reference value $S_M$ by the correction coefficient $K_M$ (that is, $R_M'$ may be $K_M S_M$).

As described above, if the internal resistance calculation unit 210 is unable to calculate the internal resistance R appropriately, the first correction value calculation unit 223 calculates the internal resistance $R_M'$, based on the correction coefficient $K_M$. Accordingly, even if the internal resistance calculation unit 210 is unable to calculate the internal resistance R of the battery BAT, the first correction value calculation unit 223 can calculate the internal resistance $R_M'$ appropriately according to current SoC and/or temperature of the battery BAT.

The second correction unit 230 is configured to calculate internal resistance $R_{L\text{-}S}'$ (to be described later), which is used for calculation of internal resistance $R_L'$, which is an estimated present value of the internal resistance $R_L$, and $R_S'$, which is an estimated present value of the internal resistance $R_S$. The internal resistance $R_L'$ and $R_S'$ are used for calculation of the estimated internal resistance $R_{now}$ (to be described later). Specifically, the second correction unit 230 functionally includes a second reference value obtaining unit 231, the second correction coefficient calculation unit 232, and a second correction value calculation unit 233.

The second reference value obtaining unit 231 is configured to obtain a reference value $S_{L\text{-}S}$, which is a reference value for the internal resistance $R_{L\text{-}S}$ and is dependent on present SoC and present temperature of the battery BAT, at predetermined timing (for example, at regular intervals). For example, a map (hereinafter, referred to as an "$S_{L\text{-}S}$ map") of SoC and temperature of the battery BAT to a reference value $S_{L\text{-}S}$ may be stored in the memory of the controller 20, and the second reference value obtaining unit 231 may obtain the reference value $S_{L\text{-}S}$ corresponding to present SoC and present temperature of the battery BAT therefrom each time the voltage V and the current I are obtained. The second reference value obtaining unit 231 outputs the reference value $S_{L\text{-}S}$ to the second correction coefficient calculation unit 232 and the second correction value calculation unit 233. The reference value $S_{L\text{-}S}$ is an example of a second reference value, and the $S_{L\text{-}S}$ map is an example of a second map.

In the above example, the reference value $S_{L\text{-}S}$ corresponding to present SoC and temperature of the battery BAT is obtained by the second reference value obtaining unit 231 from the $S_{L\text{-}S}$ map stored in advance in the controller 20, but the present disclosure is not limited thereto. For example, instead of the $S_{L\text{-}S}$ map, a map (hereinafter, also referred to as an "$S_L$ map") of SoC and temperature of the battery BAT to a reference value $S_L$, which is a reference value for the internal resistance $R_L$, and a map (hereinafter, also referred to as an "$S_S$ map") of SoC and temperature of the battery BAT to a reference value $S_S$, which is a reference value for the internal resistance $R_S$ may be stored in the controller 20.

In this case, each time the voltage V and the current I are obtained, the second reference value obtaining unit 231 may obtain the reference value $S_L$ corresponding to present SoC and present temperature of the battery BAT from the $S_L$ map and may obtain the reference value $S_S$ corresponding to the present SoC and the present temperature of the battery BAT from the $S_S$ map. Then, the second reference value obtaining unit 231 may calculate the reference value $S_{L\text{-}S}$ by subtracting $S_S$ from $S_L$ (that is, $S_{L\text{-}S}$ may be $S_L - S_S$). In this manner, the second reference value obtaining unit 231 can obtain the reference value $S_{L\text{-}S}$ corresponding to present SoC and present temperature of the battery BAT.

The second correction coefficient calculation unit 232 is configured to calculate a correction coefficient $k_{L\text{-}M}$, which indicates how great difference between the internal resistance $R_{L\text{-}S}$ calculated by the internal resistance calculation unit 210 and the reference value $S_{L\text{-}S}$ obtained by the second reference value obtaining unit 231 is. The second correction coefficient calculation unit 232 calculates the correction coefficient $k_{L\text{-}S}$, for example, by dividing the internal resistance $R_{L\text{-}S}$ by the reference value $S_{L\text{-}S}$ (that is, $k_{L\text{-}S}$ may be $R_{L\text{-}S}/S_{L\text{-}S}$). In this case, the correction coefficient $k_{L\text{-}S}$ indicates how great difference between the internal resistance $R_{L\text{-}S}$ and the reference value $S_{L\text{-}S}$ is by the ratio of the internal resistance $R_{L\text{-}S}$ to the reference value $S_{L\text{-}S}$. The second correction coefficient calculation unit 232 outputs the correction coefficient $k_{L\text{-}S}$ to the second correction value calculation unit 233.

The second correction value calculation unit 233 is configured to calculate the internal resistance $R_{L\text{-}S}$ by correcting the reference value $S_{L\text{-}S}$ acquired by the second reference value obtaining unit 231 using the correction coefficient $k_{L\text{-}S}$ calculated by the second correction coefficient calculation unit 232. The second correction value calculation unit 233 calculates the internal resistance $R_{L\text{-}S}$, for example, by multiplying the reference value $S_{L\text{-}S}$ by the correction coefficient $k_{L\text{-}S}$ (that is, $R_{L\text{-}S}$ may be $k_{L\text{-}S} S_{L\text{-}S}$) and outputs it to the conversion unit 240. The internal resistance $R_{L\text{-}S}$ is an example of a second correction value.

If the internal resistance calculation unit 210 is unable to calculate the internal resistance R appropriately, the second correction coefficient calculation unit 232 is also unable to calculate the correction coefficient $k_{L\text{-}S}$ appropriately as well as the first correction coefficient calculation unit 222 is unable to calculate the correction coefficient $k_M$ appropriately. In this case, the second correction value calculation unit 233 is also unable to calculate the internal resistance $R_{L\text{-}S}'$ appropriately based on the correction coefficient $k_{L\text{-}S}$. In such a case, the internal resistance $R_{L\text{-}S}'$ that has been appropriately calculated most recently may be usable. In this case, however, the internal resistance $R_{L\text{-}S}'$ cannot quickly respond to fluctuation in SoC and/or temperature of the battery BAT, deteriorating accuracy of the estimated internal resistance $R_{now}$, which is calculated based on the internal resistance $R_{L\text{-}S}'$.

Therefore, if the internal resistance calculation unit 210 is unable to calculate the internal resistance R appropriately (for example, if the voltage fluctuation $\Delta V$ and/or the current fluctuation $\Delta I$ is within a predetermined range centered on 0), the second correction value calculation unit 233 calculates the internal resistance $R_{L\text{-}S}'$ by correcting the reference value $S_{L\text{-}S}$ obtained by the second reference value obtaining unit 231 using the correction coefficient $k_{L\text{-}S}$ that has been calculated in the past In the present embodiment, in order to calculate the internal resistance $R_{L\text{-}S}'$ appropriately by the second correction value calculation unit 233 even if the internal resistance calculation unit 210 is unable to calculate the internal resistance R of the battery BAT appropriately, the second correction unit 230 further includes a second learning unit 234. After the second correction coefficient calculation unit 232 calculates the correction coefficient $k_{L\text{-}S}$, the second correction coefficient calculation unit 232 outputs the correction coefficient $k_{L\text{-}S}$ also to the second learning unit 234.

The second learning unit 234 is configured to learn from the correction coefficient $k_{L\text{-}S}$ calculated by the second correction coefficient calculation unit 232 and to output a correction coefficient $K_{L\text{-}S}$ as training results to the second correction value calculation unit 233. In the present embodiment, the correction coefficient $K_{L\text{-}S}$ is the correction coefficient $k_{L\text{-}S}$ averaged over a certain period of time, but the present disclosure is not limited thereto. For example, the correction coefficient $K_{L\text{-}S}$ may be the median instead of the average. The certain period may be a past predetermined period or may start when (to be described later) the second learning unit 234 starts learning most recently, but the present disclosure is not limited thereto. The certain period may be predetermined by the manufacturer of the vehicle 10 or the controller 20 and may be stored in the memory of the controller 20.

If the internal resistance calculation unit 210 is unable to calculate the internal resistance R appropriately, or if the second correction coefficient calculation unit 232 is unable to calculate the correction coefficient $k_{L\text{-}S}$, the second correction value calculation unit 233 obtains the correction coefficient $K_{L\text{-}S}$ from the second learning unit 234.

In this case, the second correction value calculation unit 233 calculates the internal resistance $R_{L\text{-}S}'$, based on the correction coefficient $K_{L\text{-}S}$ obtained from the second learning unit 234 instead of the correction coefficient $k_{L\text{-}S}$. That is, the second correction value calculation unit 233 calculates the internal resistance $R_{L\text{-}S}'$ by multiplying the reference value $S_{L\text{-}S}$ by the correction coefficient $K_{L\text{-}S}$ (that is, $R_{L\text{-}S}$ may be $K_{L\text{-}S} S_{L\text{-}S}$).

As described above, if the internal resistance calculation unit 210 is unable to calculate the internal resistance R appropriately, the second correction value calculation unit 233 calculates the internal resistance $R_{L\text{-}S}$, based on the correction coefficient $K_{L\text{-}S}$. Accordingly, even if the internal resistance calculation unit 210 is unable to calculate the internal resistance R of the battery BAT, the second correction value calculation unit 233 can calculate the internal resistance $R_{L\text{-}S}$ appropriately according to current SoC and/or temperature of the battery BAT.

The conversion unit 240 is configured to obtain the internal resistance $R_M'$, $R_L'$, and $R_S'$, based on information received from the first correction value calculation unit 223 and the second correction value calculation unit 233 and to output them to the estimation unit 250.

The internal resistance $R_M'$ is obtainable from the first correction value calculation unit 223. The internal resistance $R_L'$ and $R_S'$ is calculable from the internal resistance $R_M'$ and $R_{L\text{-}S}'$ (for example, $R_L'=R_M'+R_{L\text{-}S}'/2$, and $R_S'=R_M'-R_{L\text{-}S}'/2$).

The estimation unit 250 is configured to calculate the estimated internal resistance $R_{now}$, which is the estimated present value of the internal resistance R of the battery BAT, based on the internal resistance $R_M'$, $R_L'$, and $R_S'$ received from the conversion unit 240 and the voltage $V_{now}$, which is the present value of the voltage V of the battery BAT measured by the voltmeter 12a.

In the present embodiment, for example, if the voltage $V_{now}$ is below a predetermined voltage upper limit $V_{H\_limit}$ and difference between the voltage upper limit $V_{H\_limit}$ and the voltage $V_{now}$ is below a predetermined threshold $V_A$ (that is, if $V_{H\_limit}-V_{now} \leq V_A$), the estimation unit 250 calculates the estimated internal resistance $R_{now}$, for example, from the following equation (1).

Equation 1

$$R_{now} = R_L' + K_A\left(1 - \frac{V_{H\_limit} - V_{now}}{V_a}\right)(R_L' - R_M') \tag{1}$$

In the above equation (1), the coefficient $K_A$ is a predetermined positive constant ($K_A > 0$).

In the present embodiment, if the voltage $V_{now}$ is below the voltage upper limit $V_{H\_limit}$ and the difference between the voltage upper limit $V_{H\_limit}$ and the voltage $V_{now}$ exceeds the predetermined threshold $V_A$ (that is, if $V_{H\_limit}-V_{now} > V_A$), the estimation unit 250 considers the internal resistance $R_L'$ as the estimated internal resistance $R_{now}$.

On the other hand, if an overshoot in which the voltage $V_{now}$ exceeds the voltage upper limit $V_{H\_limit}$ is observed, the estimation unit 250 calculates the estimated internal resistance $R_{now}$, for example, from the following equation (2).

Equation 2

$$R_{now} = \left(1 - \frac{V_{now} - V_{H\_limit}}{V_B}\right)[R_L' + K_A(R_L' - R_M')] + \frac{V_{now} - V_{H\_limit}}{V_B}[R_S' + K_B(R_S' - R_M')] \tag{2}$$

In the above equation (2), the coefficient $K_A$ is the coefficient $K_A$ in the above equation (1), the coefficient $K_B$ is a predetermined positive constant ($K_B > 0$), and the voltage $V_B$ is a predetermined threshold.

By the estimation unit 250 calculating the estimated internal resistance $R_{now}$, based on the internal resistance $R_M'$, $R_L'$, and $R_S'$ in this manner, it becomes possible for the controller 20 to calculate the estimated internal resistance $R_{now}$, which is the estimated present value of the internal resistance R of the battery BAT, with high accuracy. Therefore, it becomes possible for the controller 20 to control charge and discharge of the battery BAT appropriately based on the estimated internal resistance $R_{now}$ that is highly accurate.

In the present embodiment, the internal resistance $R_M'$ is calculated to correct the R component Ma in the internal resistance R of the battery BAT, and the internal resistance $R_{L\text{-}S}'$ is calculated to correct the parallel-RC component Mb in the internal resistance R of the battery BAT. By calculating the estimated internal resistance $R_{now}$, based on the internal resistance $R_M'$ and $R_{L\text{-}S}'$, it becomes possible to calculate the estimated internal resistance $R_{now}$ highly accurately with difference in characteristics between the R component Ma and the parallel-RC component Mb considered.

If the internal resistance calculation unit 210 can calculate the internal resistance R (for example, if neither the voltage fluctuation $\Delta V$ nor the current fluctuation $\Delta I$ is within the predetermined range centered on 0, or both are sufficiently large), the controller 20 may control charge and discharge of the battery BAT, based on the internal resistance R calculated by the internal resistance calculation unit 210. In this case, when the internal resistance calculation unit 210 can calculate the internal resistance R appropriately, it becomes possible to reduce the processing load on the controller 20 during the control of the charge and discharge of the battery BAT.

When the internal resistance calculation unit 210 is ready to calculate the internal resistance R, since the number of samples of the internal resistance R is small, the internal resistance $R_M$ and the correction coefficient $k_M$, which is calculated based on the internal resistance $R_M$, tend to be unstable. If the first learning unit 224 learns from such unstable correction coefficients $k_M$, appropriacy of the correction coefficient $K_M$, which is calculated by the first learning unit 224 as the training results, may deteriorate.

Therefore, the first learning unit 224 may start learning after the internal resistance calculation unit 210 has calculated the internal resistance R appropriately for a certain period of time. That is, the first learning unit 224 may start learning when the certain period has passed since the internal resistance calculation unit 210 is ready to calculate the internal resistance R. In this case, in order to enhance appropriacy of the correction coefficient $K_M$, the first learning unit 224 does not learn from the correction coefficient $k_M$ that is calculated immediately after the internal resistance calculation unit 210 is ready to calculate the internal resistance R and can learn from the correction coefficient $k_M$ that is stable. The certain period may be predetermined by the manufacturer of the vehicle 10 or the controller 20 and may be stored in the memory of the controller 20.

Similarly to the first learning unit 224, the second learning unit 234 may start learning after the internal resistance calculation unit 210 has calculated the internal resistance R appropriately for a certain period of time. That is, the second learning unit 234 may start learning when the certain period has passed since the internal resistance calculation unit 210 is ready to calculate the internal resistance R. In this case, since the second learning unit 234 can learn from the correction coefficient $k_{L-S}$ that is stable, it becomes possible to enhance appropriacy of the correction coefficient $K_{L-S}$. The certain period may be predetermined by the manufacturer of the vehicle 10 or the controller 20 and may be stored in the memory of the controller 20.

The first learning unit 224 may stop learning if the internal resistance calculation unit 210 has been unable to calculate the internal resistance R appropriately for a certain period of time. That is, the first learning unit 224 may stop learning when the certain period has passed since the internal resistance calculation unit 210 is unable to calculate the internal resistance R appropriately. In this case, since the first learning unit 224 does not learn from the correction coefficient $k_M$ that is calculated when the internal resistance calculation unit 210 is unable to calculate the internal resistance R appropriately, it becomes possible to enhance appropriacy of the correction coefficient $K_M$. The certain period may be predetermined by the manufacturer of the vehicle 10 or the controller 20 and may be stored in the memory of the controller 20.

Similarly to the first learning unit 224, the second learning unit 234 may stop learning if the internal resistance calculation unit 210 has been unable to calculate the internal resistance R appropriately for a certain period of time. That is, the second learning unit 234 may stop learning when the certain period has passed since the internal resistance calculation unit 210 is unable to calculate the internal resistance R appropriately. In this case, since the second learning unit 234 does not learn from the correction coefficient $k_{L-S}$ that is calculated when the internal resistance calculation unit 210 is unable to calculate the internal resistance R appropriately, it becomes possible to enhance appropriacy of the correction coefficient $K_{L-S}$. The certain period may be predetermined by the manufacturer of the vehicle 10 or the controller 20 and may be stored in the memory of the controller 20.

In the examples described above, the first learning unit 224 and/or the second learning unit 234 may stop learning when a certain period has passed since the internal resistance calculation unit 210 is unable to calculate the internal resistance R appropriately, but the present disclosure is not limited thereto.

For example, the first learning unit 224 may stop learning when at least the SoC, the battery temperature, or the reference value $S_M$ corresponding to the SoC and/or the battery temperature changes more widely than a certain value from the value when the internal resistance calculation unit 210 appropriately calculated the internal resistance R most recently.

Specifically, for example, when the internal resistance calculation unit 210 appropriately calculated the internal resistance R, the controller 20 may store SoC of the battery BAT in the memory of the controller 20. Thereafter, if the internal resistance calculation unit 210 is unable to calculate the internal resistance R appropriately, the controller 20 may compare the present SoC with the SoC stored in the memory and may determine whether the SoC fluctuated more widely than the certain value. The certain value may be predetermined by the manufacturer of the vehicle 10 or the controller 20 and may be stored in the memory of the controller 20.

If the controller 20 determines that the SoC fluctuated more widely than the predetermined value, the controller 20 may cause the first learning unit 224 to stop learning. In this case, since the first learning unit 224 does not learn from the correction coefficient $k_M$ that is calculated when the internal resistance calculation unit 210 is unable to calculate the internal resistance R appropriately, it becomes possible to enhance appropriacy of the correction coefficient $K_M$.

In the example described above, the first learning unit 224 stops learning when the SoC fluctuated more widely than a certain value, but the present disclosure is not limited thereto. The controller 20 may cause the first learning unit 224 to stop learning when, instead of the SoC, the battery temperature and/or the reference value $S_M$ corresponding to the SoC and/or the battery temperature fluctuated more widely than a certain value. In either case, similar effects can be obtained.

Similarly to the first learning unit 224, the second learning unit 234 may stop learning when at least the SoC, the battery temperature, or the reference value $S_M$ corresponding to the SoC and/or the battery temperature changes more widely than a certain value from the value when the internal resistance calculation unit 210 appropriately calculated the internal resistance R most recently. In this case, since the second learning unit 234 does not learn from the correction coefficient $k_{L-S}$ that is calculated when the internal resistance calculation unit 210 is unable to calculate the internal resistance R appropriately, it becomes possible to enhance appropriacy of the correction coefficient $K_{L-S}$.

Example of Relation Among State of Battery, Internal Resistance, Correction Value, and Reference Value Next, relation among a state of the battery BAT, the internal resistance R (in this example, specifically, the internal resistance $R_M$), the correction value (in this example, specifically, the internal resistance $R_M'$), and the reference value (in this example, specifically, the reference value $S_M$) will be described with reference to FIGS. 6A to 6C. The internal resistance R, the correction value, and the reference value are obtained by the controller 20.

Figures 6A, 6B, 6C:
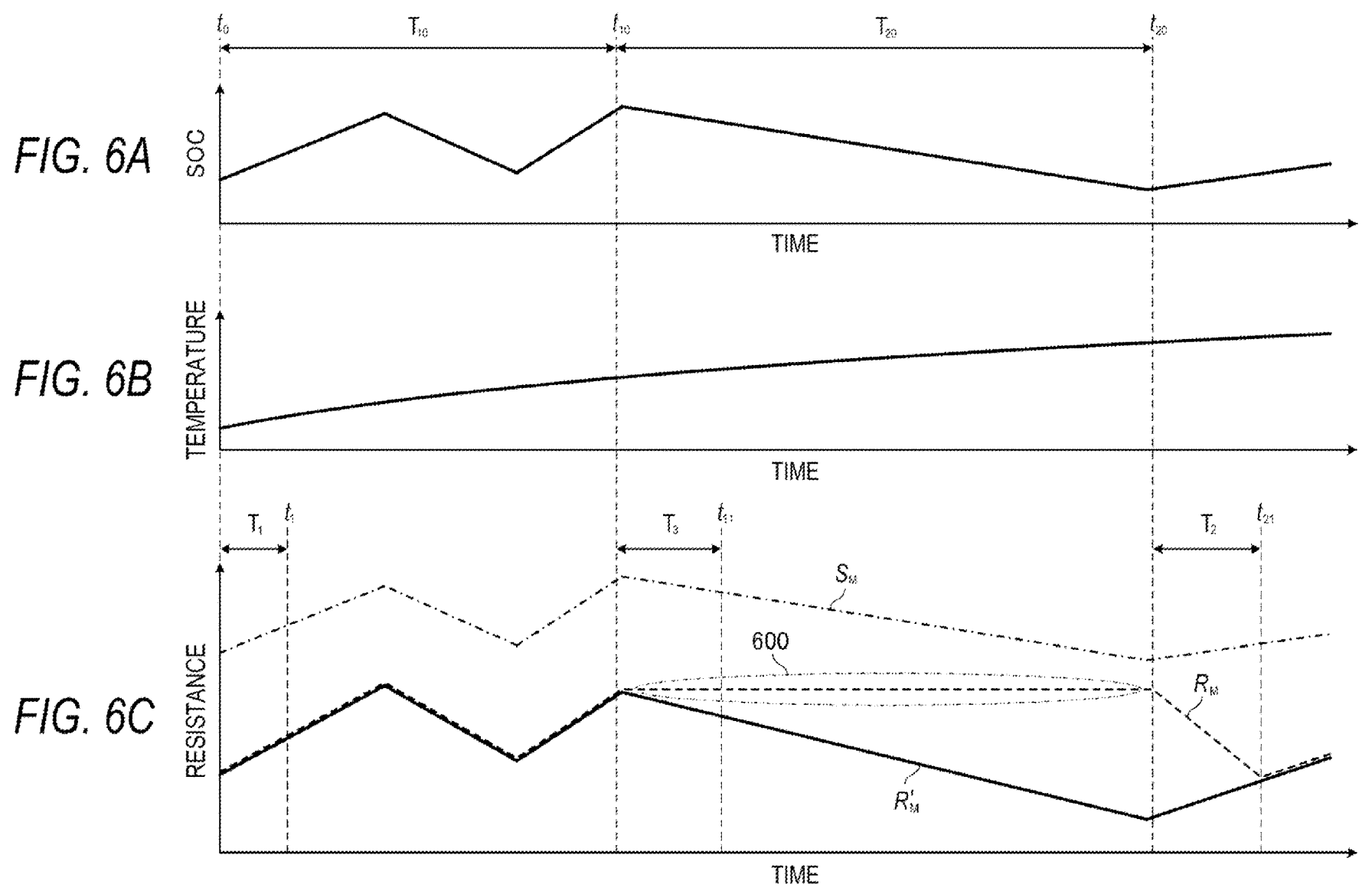

In FIG. 6A, the vertical axis represents SoC of the battery BAT, and the horizontal axis represents a time. In FIG. 6B, the vertical axis represents temperature of the battery BAT, and the horizontal axis represents a time. In FIG. 6C, the vertical axis represents resistance, and the horizontal axis represents a time.

In FIGS. 6A to 6C, a time $t_0$ is a time at which the system of the vehicle 10 is booted up (for example, when the ignition is switched on). During a period $T_{10}$, which is a period of time from the time $t_0$ to a time $t_{10}$, and a period after a time $t_{20}$, considerable fluctuation in electric power in the battery BAT is observed, for example, due to frequent acceleration and/or deceleration of the vehicle 10. That is, during the period $T_{10}$ and the period after the time $t_{20}$, the internal resistance calculation unit 210 can appropriately calculate the internal resistance R. In contrast, a period $T_{20}$, which is a period of time from the time $t_{10}$ to the time $t_{20}$, considerable power fluctuation of the battery BAT is not observed, for example, with the vehicle 10 cruising at a constant speed. That is, during the period $T_{20}$, the internal resistance calculation unit 210 is unable to calculate the internal resistance R appropriately.

During the period $T_{10}$, since the internal resistance calculation unit 210 can calculate the internal resistance R appropriately, the internal resistance $R_M'$, which is a correction value, is calculated based on the reference value $S_M$ corresponding to SoC and temperature of the battery BAT and the correction coefficient $k_M$. In this case, the internal resistance $R_M'$ is equal to the internal resistance $R_M$ (since $R_M'=k_M S_M=R_M S_M/S_M$).

In contrast, during the period $T_{20}$, since the internal resistance calculation unit 210 is unable to calculate the internal resistance R appropriately, the internal resistance $R_M'$, which is a correction value, is calculated based on the reference value $S_M$ corresponding to SoC and temperature of the battery BAT and the correction coefficient $K_M$, which is training results by the first learning unit 224. In this case, as shown in FIGS. 6A to 6C, the internal resistance $R_M'$ is responsive to fluctuation in SoC and temperature of the battery BAT.

If internal resistance $R_M'$ appropriately calculated most recently were used for the calculation during the period $T_{20}$, the internal resistance $R_M'$ would be a constant value (see part surrounded by the ellipse 600 shown in FIG. 6C) and unresponsive to fluctuation in SoC and temperature of the battery BAT.

The controller 20 may be configured to cause the first learning unit 224 and/or the second learning unit 234 to start learning when a predetermined period has passed since the internal resistance calculation unit 210 was ready to calculate the internal resistance R appropriately. In FIGS. 6A to 6C, the internal resistance calculation unit 210 is ready to calculate the internal resistance R appropriately, for example, at the time to. Therefore, the controller 20 causes the first learning unit 224 and the second learning unit 234 to start learning at a time $t_1$, which is a time at which a predetermined period $T_1$ has passed since the time to.

Similarly to the time $t_0$, the internal resistance calculation unit 210 is ready to calculate the internal resistance R appropriately also at the time $t_{20}$. Therefore, the controller 20 causes the first learning unit 224 and the second learning unit 234 to start learning at a time $t_{21}$, which is a time at which a predetermined period $T_2$ has passed since the time $t_{20}$. The duration of the predetermined period $T_1$ may be the same as or different from that of the predetermined period $T_2$.

The controller 20 may be configured to cause the first learning unit 224 and/or the second learning unit 234 to stop learning when the internal resistance calculation unit 210 has been unable to calculate the internal resistance R appropriately for a predetermined period. In FIGS. 6A to 6C, the internal resistance calculation unit 210 becomes unable to calculate the internal resistance R appropriately at the time $t_{10}$. Therefore, the controller 20 causes the first learning unit 224 and the second learning unit 234 to stop learning at a time $t_{11}$, which is a time at which a predetermined period $T_3$ has passed since the time $t_{10}$.

During a period of time immediately after internal resistance calculation unit 210 is ready to calculate the internal resistance R, the correction coefficients $k_M$ and $k_{L-S}$ tend to be unstable. During this period, the controller 20 may calculate the correction values by a similar method as when the internal resistance calculation unit 210 is unable to calculate the internal resistance R.

In FIGS. 6A to 6C, similarly to the period $T_{20}$, the controller 20 calculates the internal resistance $R_M'$, which is a correction value, based on the reference value $S_M$ corresponding to SoC and temperature of the battery BAT and the correction coefficient $K_M$, which is training results by the first learning unit 224, during the predetermined period $T_2$ immediately after the time $t_{20}$.

As described above, if the internal resistance calculation unit 210 is unable to calculate the internal resistance R of the battery BAT appropriately, the controller 20 calculate the internal resistance $R_M'$ by correcting the reference value $S_M$ corresponding to present SoC and present temperature of the battery BAT, based on the correction coefficient $k_M$ calculated in the past (based on, the correction coefficient $K_M$, which is, for example, the correction coefficient $k_M$ averaged over a past certain period of time).

If the internal resistance calculation unit 210 is unable to calculate the internal resistance R of the battery BAT appropriately, the controller 20 calculate the internal resistance $R_{L-S}'$ by correcting the reference value $S_{L-S}$ corresponding to present SoC and present temperature of the battery BAT, based on the correction coefficient $k_{L-S}$ calculated in the past (based on, the correction coefficient $K_{L-S}$, which is, for example, the correction coefficient $k_{L-S}$ averaged over a past certain period of time).

The controller 20 calculates the internal resistance estimate $R_{now}$, based on the internal resistance $R_M'$ and $R_{L-S}'$. Therefore, for example, even if no considerable power fluctuation of the battery BAT is observed and the internal resistance calculation unit 210 is unable to calculate the internal resistance R of the battery BAT, it becomes possible to calculate the estimated internal resistance $R_{now}$ with high accuracy (reliability), enabling appropriate control of charge and/or discharge of the battery BAT, based on the internal resistance estimate $R_{now}$.

Although some embodiments of the present disclosure have been described above, the present disclosure is not limited thereto. Modifications, improvements, and the like can be made as appropriate. Components in each embodiment can be combined freely within the gist of the present disclosure.

For example, in the above embodiment, the controller 20 controls both charge and discharge of the battery BAT, but the present invention is not limited thereto. For example, the controller 20 may control only one of the charge and discharge of the battery BAT.

Although the vehicle power storage system 50 is installed in the vehicle 10 that is a hybrid electric vehicle in the above, the present disclosure is not limited thereto. The vehicle 10, in which the vehicle power storage system 50 is installed, may be, for example, an electric vehicle (such as a battery electric vehicle) or a fuel cell electric vehicle.

In the present specification, at least the following are described. The present disclosure is not limited to elements or the like in parentheses.

(1) A power storage system (vehicle power storage system 50) including:

a battery (BAT);

a voltmeter (12a) configured to measure voltage (V) of the battery (BAT);

an ammeter (12b) configured to measure current (I) of the battery (BAT);

a temperature sensor (12c) configured to measure temperature of the battery (BAT);

a controller (20) configured to control charge and/or discharge of the battery (BAT), based on the voltage (V) measured by the voltmeter (12a), the current (I) measured by the ammeter (12b), and the temperature measured by the temperature sensor (12c), in which the controller (20) includes:

an internal resistance calculation unit (210) configured to calculate internal resistance (R) of the battery (BAT), based on the voltage (V, $V_{now}$) and the current (I, $I_{now}$);

a reference value obtaining unit (first reference value obtaining unit 221, second reference value obtaining unit 231) configured to obtain a reference value ($S_M$, $S_{L-S}$) for the internal resistance ($R_M$, $R_{L-S}$) of the battery (BAT) corresponding to present state of charge and present temperature of the battery (BAT) from a map ($S_M$ map, $S_{L-S}$ map) of the state of charge and the temperature of the battery (BAT) to the reference value ($S_M$, $S_{L-S}$);

a correction coefficient calculation unit (first correction coefficient calculation unit 222, second correction coefficient calculation unit 232) configured to calculate a correction coefficient ($k_M$, $k_{L-S}$) indicating how great difference between the internal resistance ($R_M$, $R_{L-S}$) calculated by the internal resistance calculation unit (210) and the reference value ($S_M$, $S_{L-S}$) obtained by the reference value obtaining unit (first reference value obtaining unit 221, second reference value obtaining unit 231) is;

a correction value calculation unit (first correction value calculation unit 223, second correction value calculation unit 233) configured to calculate a correction value (internal resistance $R_M'$, $R_{L-S}'$) by correcting the reference value ($S_M$, $S_{L-S}$) obtained by the reference value obtaining unit (first reference value obtaining unit 221, second reference value obtaining unit 231) using the correction coefficient ($k_M$, $k_{L-S}$) calculated by the correction coefficient calculation unit (first correction coefficient calculation unit 222, second correction coefficient calculation unit 232); and an estimation unit (250) configured to calculate estimated internal resistance ($R_{now}$), which is an estimated present value of the internal resistance (R) of the battery (BAT), based on the correction value (internal resistance $R_M'$, $R_{L-S}'$) calculated by the correction value calculation unit (first correction value calculation unit 223, second correction value calculation unit 233) and the present voltage ($V_{now}$), the controller (20) is configured to control the charge and/or discharge of the battery (BAT), based on the internal resistance (R) calculated by the internal resistance calculation unit (210) or the estimated internal resistance ($R_{now}$) calculated by the estimation unit (250), and the correction value calculation unit (first correction value calculation unit 223, second correction value calculation unit 233) is configured to calculate the correction value (internal resistance $R_M'$, $R_{L-S}'$) by correcting the reference value ($S_M$, $S_{L-S}$) using the correction coefficient ($k_M$, $k_{L-S}$) calculated in the past when the internal resistance calculation unit (210) is unable to calculate the internal resistance (R).

According to (1), if the internal resistance calculation unit is unable to calculate the internal resistance of the battery, it is possible to calculate the estimated present internal resistance of the battery, based on the correction value calculated by correcting the reference value corresponding to the present state of charge and the present temperature of the battery using the correction coefficient calculated in the past. Therefore, for example, even if no considerable power fluctuation of the battery is observed and the internal resistance calculation unit is unable to calculate the internal resistance of the battery, it is possible to calculate the estimated internal resistance with high accuracy (reliability), enabling appropriate control of the charge and/or discharge of the battery, based on the estimated internal resistance.

(2) The power storage system (vehicle power storage system 50) according to (1), in which the controller (20) further includes a learning unit (first learning unit 224, second learning unit 234) configured to learn from the correction coefficient ($k_M$, $k_{L-S}$) calculated by the correction coefficient calculation unit (first correction coefficient calculation unit 222, second correction coefficient calculation unit 232), the correction value calculation unit (first correction value calculation unit 223, second correction value calculation unit 233) is configured to calculate the correction value ($R_M'$, $R_{L-S}'$) by correcting the reference value ($S_M$, $S_{L-S}$) using training results ($K_M$, $K_{L-S}$) by the learning unit (first learning unit 224, second learning unit 234) when the internal resistance calculation unit (210) is unable to calculate the internal resistance (R), and the training result ($K_M$, $K_{L-S}$) are an average or a median of the correction coefficient ($k_M$, $k_{L-S}$) calculated in a past period.

According to (2), since the correction value can be calculated based on the average or median of the correction coefficient calculated in the past period if the internal resistance calculation unit is unable to calculate the internal resistance, it is possible to calculate the correction value appropriately.

(3) The power storage system (vehicle power storage system 50) according to (2), in which the learning unit (first learning unit 224, second learning unit 234) is configured to start learning when a predetermined period ($T_1$, $T_2$) has passed since the internal resistance calculation unit (210) is ready to calculate the internal resistance (R).

According to (3), since the learning unit can start learning when the predetermined period has passed since the internal resistance calculation unit is ready to calculate the internal resistance, it is possible to improve the training results by the learning unit.

(4) The power storage system (vehicle power storage system 50) according to (2) or (3), in which the learning unit (first learning unit 224, second learning unit 234) is configured to stop learning when the internal resistance calculation unit (210) has been unable to calculate the internal resistance (R) for a predetermined period ($T_3$).

According to (4), since the learning unit can stop learning when the internal resistance calculation unit has been unable to calculate the internal resistance for the predetermined period, it is possible to improve the training results by the learning unit.

(5) The power storage system (vehicle power storage system 50) according to (2) or (3), in which the learning unit (first learning unit 224, second learning unit 234) stops learning when at least the state of charge of the battery (BAT), the temperature of the battery (BAT), or the reference value ($S_M$, $S_{L-S}$) corresponding to the state of charge and the temperature of the battery (BAT) fluctuates more widely than a predetermined value from a value when the internal resistance calculation unit (210) calculated the internal resistance (R) most recently.

According to (5), since the learning unit can stop learning when at least the state of charge of the battery, the temperature of the battery, or the reference value corresponding to the state of charge and the temperature of the battery fluctuates more widely than the predetermined value from the value when the internal resistance calculation unit calculated the internal resistance most recently, it is possible to improve the training results by the learning unit.

(6) The power storage system (vehicle power storage system 50) according to any one of (1) to (5), in which the internal resistance (R) of the battery (BAT) includes an R component (Ma) and a parallel-RC component (Mb), the internal resistance calculation unit (210) is configured to calculate first internal resistance (internal resistance $R_M$), which reflects a characteristic of the R component (Ma), and a second internal resistance (internal resistance $R_{L-S}$), which reflects a characteristic of the parallel-RC component (Mb), the reference value obtaining unit (first reference value obtaining unit 221, second reference value obtaining unit 231) includes:

a first reference value obtaining unit (221) configured to obtain a first reference value (reference value $S_M$) corresponding to the present state of charge and the present temperature of the battery (BAT) from a first map ($S_M$ map) of the state of charge and the temperature of the battery (BAT) to the first reference value (reference value $S_M$); and a second reference value obtaining unit (221) configured to obtain a second reference value (reference value $S_{L-S}$) corresponding to the present state of charge and the present temperature of the battery (BAT) from a second map ($S_{L-S}$ map) of the state of charge and the present temperature of the battery (BAT) to the second reference value (reference value $S_{L-S}$), the correction coefficient calculation unit (first correction coefficient calculation unit 222, second correction coefficient calculation unit 232) includes:

a first correction coefficient calculation unit (222) configured to calculate a first correction coefficient (correction coefficient $k_M$), which indicates how great difference between the first internal resistance (internal resistance $R_M$) calculated by the internal resistance calculation unit (210) and the first reference value (reference value $S_M$) obtained by the first reference value obtaining unit (221) is, as the correction coefficient ($k_M$, $k_{L-S}$); and a second correction coefficient calculation unit (232) configured to calculate a second correction coefficient (correction coefficient $k_{L-S}$), which indicates how great difference between the second internal resistance (internal resistance $R_{L-S}$) calculated by the internal resistance calculation unit (210) and the second reference value (reference value $S_{L-S}$) obtained by the second reference value obtaining unit (231) is, as the correction coefficient ($k_M$, $k_{L-S}$), the correction value calculation unit (first correction value calculation unit 223, second correction value calculation unit 233) includes:

a first correction value calculation unit (223) configured to calculate a first correction value (internal resistance $R_M'$) as the correction value (internal resistance $R_M'$, $R_{L-S}'$) by correcting the first reference value (reference value $S_M$) obtained by the first reference value acquisition unit (221) using the first correction coefficient (correction coefficient $k_M$) calculated by the first correction coefficient calculation unit (222); and a second correction value calculation unit (233) configured to calculate a second correction value (internal resistance $R_{L-S}'$) as the correction value (internal resistance $R_M'$, $R_{L-S}'$) by correcting the second reference value (reference value $S_{L-S}$) obtained by the second reference value acquisition unit (231) using the second correction coefficient (correction coefficient $k_{L-S}$) calculated by the second correction coefficient calculation unit (232), and the estimation unit (250) is configured to calculate the estimated internal resistance ($R_{now}$), based on the first correction value (internal resistance $R_M'$) calculated by the first correction value calculation unit (223) and the second correction value (internal resistance $R_{L-S}'$) calculated by the second correction value calculation unit (233).

According to (6), since the estimated present internal resistance of the battery can be calculated based on the correction value calculated for each of the R and the parallel-RC components in the internal resistance of the battery, it is possible to consider difference in characteristics between the R the parallel-RC parallel components in order to enable highly accurate calculation of the estimated present internal resistance.

What is claimed is:

1. A power storage system comprising:

a battery;

a voltmeter configured to measure voltage of the battery;

an ammeter configured to measure current of the battery;

a temperature sensor configured to measure temperature of the battery; and processing circuitry configured to:

calculate internal resistance of the battery, based on the voltage and the current;

obtain a reference value for the internal resistance of the battery corresponding to a present state of charge and a present temperature of the battery from a map of the state of charge and the temperature to the reference value;

calculate a correction coefficient indicating a difference between the internal resistance and the reference value;

calculate a correction value by correcting the reference value using the correction coefficient;

calculate estimated internal resistance, which is an estimated present value of the internal resistance, based on the correction value and a present voltage;

control charge and/or discharge of the battery, based on the internal resistance or the estimated internal resistance; and calculate the correction value by correcting the reference value using the correction coefficient calculated in the past when a voltage fluctuation $\Delta V$ or a current fluctuation $\Delta I$ is 0 (zero), and the processing circuitry is unable to calculate the internal resistance.

2. The power storage system according to claim 1, wherein the processing circuitry is further configured to:

learn from the correction coefficient; and calculate the correction value by correcting the reference value using training results by the processing circuitry when the processing circuitry is unable to calculate the internal resistance, and the training results are an average or a median of the correction coefficient calculated in a past period.

3. The power storage system according to claim 2, wherein the processing circuitry is further configured to start learning when a predetermined period has passed since the processing circuitry is ready to calculate the internal resistance.

4. The power storage system according to claim 2, wherein the processing circuitry is further configured to stop learning when the processing circuitry has been unable to calculate the internal resistance for a predetermined period.

5. The power storage system according to claim 2, wherein the processing circuitry stops learning when at least the state of charge, the temperature, or the reference value corresponding to the state of charge and the temperature fluctuates more than a predetermined value from a value when the processing circuitry calculated the internal resistance most recently.

6. The power storage system according to claim 1, wherein the internal resistance includes an R component and a parallel-RC component connected in series, and the processing circuitry is further configured to:

calculate first internal resistance, which reflects a characteristic of the R component, and a second internal resistance, which reflects a characteristic of the parallel-RC component;

obtain a first reference value corresponding to the present state of charge and the present temperature from a first map of the state of charge and the temperature of the battery to the first reference value;

obtain a second reference value corresponding to the present state of charge and the present temperature from a second map of the state of charge and the present temperature to the second reference value;

calculate a first correction coefficient, which indicates a difference between the first internal resistance and the first reference value;

calculate a second correction coefficient, which indicates a difference between the second internal resistance and the second reference value;

calculate a first correction value by correcting the first reference value using the first correction coefficient;

calculate a second correction value by correcting the second reference value using the second correction coefficient; and calculate the estimated internal resistance, based on the first and the second correction values.

* * * * *